(12) United States Patent
Gruber et al.

(10) Patent No.: US 9,140,735 B2
(45) Date of Patent: Sep. 22, 2015

(54) INTEGRATION OF CURRENT MEASUREMENT IN WIRING STRUCTURE OF AN ELECTRONIC CIRCUIT

(71) Applicant: Infineon Technologies AG, Neubiberg (DE)

(72) Inventors: Martin Gruber, Schwandorf (DE); Angela Kessler, Sinzing (DE)

(73) Assignee: Infineon Technologies AG, Neubiberg (DE)

( * ) Notice: Subject to any disclaimer, the term of this patent is extended or adjusted under 35 U.S.C. 154(b) by 120 days.

(21) Appl. No.: 13/886,285

(22) Filed: May 3, 2013

(65) Prior Publication Data

US 2014/0327458 A1    Nov. 6, 2014

(51) Int. Cl.
| | |
|---|---|
| *G01R 27/08* | (2006.01) |
| *G01R 27/14* | (2006.01) |
| *G01R 31/26* | (2014.01) |
| *G01R 15/18* | (2006.01) |
| *G01R 31/28* | (2006.01) |
| *G01R 3/00* | (2006.01) |
| *G01R 1/20* | (2006.01) |
| *H05K 1/16* | (2006.01) |
| *G01R 13/34* | (2006.01) |
| *H05K 3/06* | (2006.01) |

(52) U.S. Cl.
CPC ............ *G01R 27/14* (2013.01); *G01R 1/203* (2013.01); *G01R 3/00* (2013.01); *G01R 15/181* (2013.01); *G01R 31/2648* (2013.01); *G01R 31/2884* (2013.01); *H05K 1/167* (2013.01); *G01R 13/347* (2013.01); *H05K 3/06* (2013.01); *H05K 2201/09736* (2013.01)

(58) Field of Classification Search
CPC ............ G01R 31/2884; G01R 15/181; G01R 31/2648; G01R 13/0272; G01R 13/347; G01R 1/072; G01R 27/14; G01R 3/00
USPC ........... 324/76.11–76.83, 439, 459, 522, 549, 324/649, 691, 713; 29/830–832
See application file for complete search history.

(56) References Cited

U.S. PATENT DOCUMENTS

| | | | | |
|---|---|---|---|---|
| 3,926,177 | A | * 12/1975 | Hardway et al. | 600/535 |
| 4,019,168 | A | 4/1977 | Collins | |
| 4,878,770 | A | 11/1989 | Ruggierio et al. | |
| 5,041,191 | A | 8/1991 | Watson | |
| 5,152,869 | A | 10/1992 | Ferraris et al. | |
| 5,482,503 | A | * 1/1996 | Scott et al. | 452/173 |

(Continued)

OTHER PUBLICATIONS

Nov. 14, 2014 examination report for pending corresponding German patent application DE 10 2014 106 025.3 and English language summary.

*Primary Examiner* — Huy Q Phan
*Assistant Examiner* — Raul Rios Russo

(57) ABSTRACT

A method of manufacturing an electronic circuit with an integrally formed capability of providing information indicative of a value of a current flowing in the electronic circuit, wherein the method comprises forming an electrically conductive wiring structure on a substrate, configuring a first section of the wiring structure for contributing to a predefined use function of the electronic circuit, and configuring a second section of the wiring structure for providing information indicative of the value of the current flowing in the electronic circuit upon applying a stimulus signal to the second section, wherein at least a part of the configuring of the first section and the configuring of the second section is performed simultaneously.

20 Claims, 4 Drawing Sheets

(56) References Cited

U.S. PATENT DOCUMENTS

| | | | |
|---|---|---|---|
| 6,262,902 B1 * | 7/2001 | Watanabe et al. | 363/74 |
| 2001/0048298 A1 * | 12/2001 | Doshita et al. | 324/76.21 |
| 2007/0057661 A1 * | 3/2007 | Sato et al. | 324/76.15 |
| 2011/0240362 A1 * | 10/2011 | Matsuo | 174/520 |

* cited by examiner

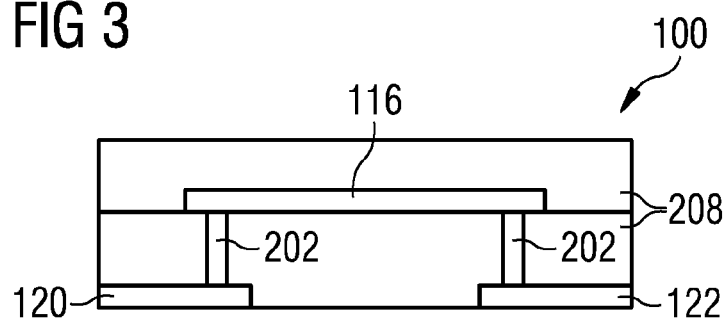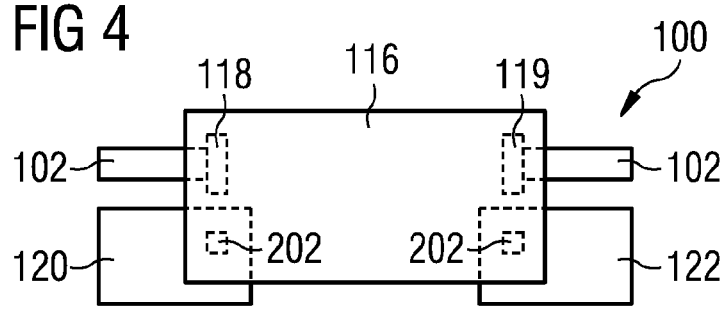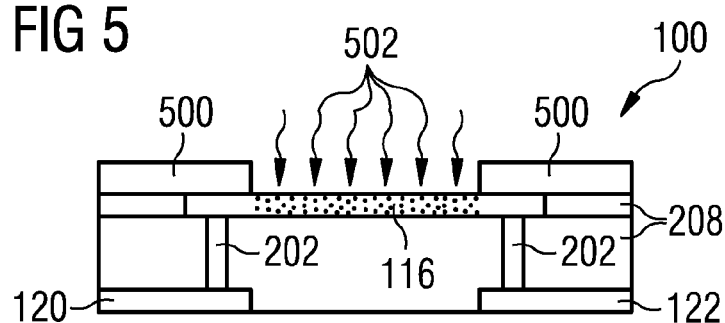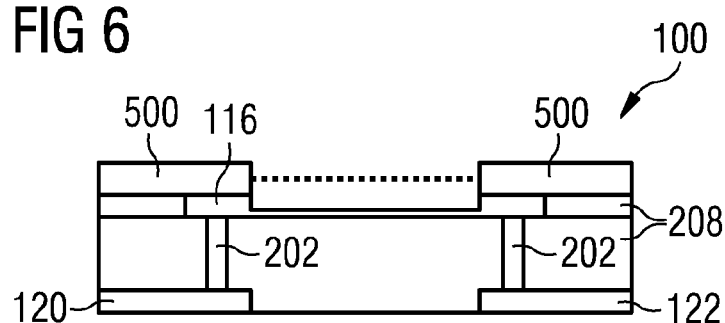

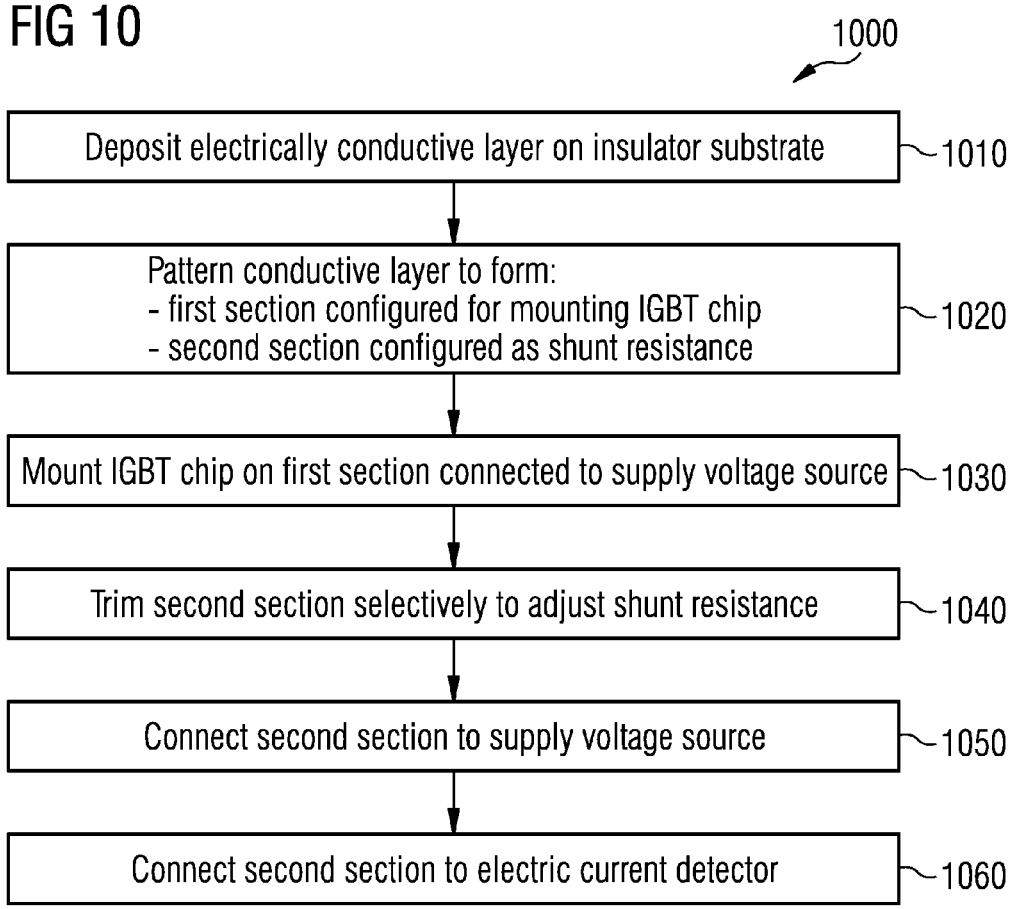
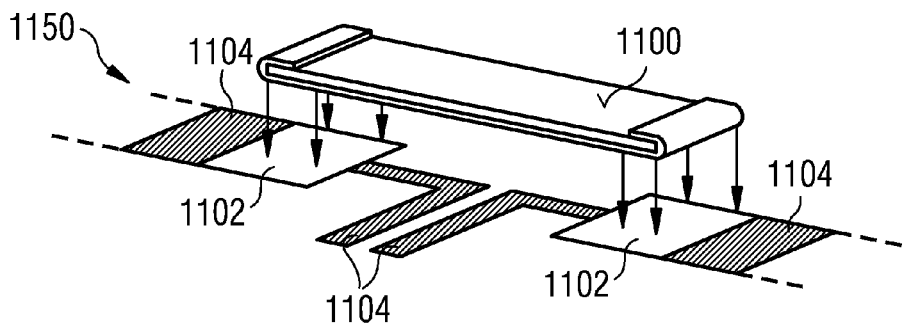

INTEGRATION OF CURRENT MEASUREMENT IN WIRING STRUCTURE OF AN ELECTRONIC CIRCUIT

BACKGROUND OF INVENTION

1. Field of the Invention

The present invention relates to methods of manufacturing an electronic circuit with a capability of providing information indicative of a value of a current flowing in the electronic circuit, to electronic circuits, and to a method of use.

2. Description of the Related Art

In electronics, a shunt denotes an electronic member with a defined value of the electrical resistance which performs a measurement of an electric current in an electronic circuit. The current which flows through a shunt causes a proportional voltage drop which can be measured.

Conventionally, shunts are mounted as separate electronic members onto a wiring on a substrate of an electronic circuit. This consumes a lot of cost, space and involves a high complexity during manufacture.

Hence, there is still potentially room to reduce manufacturing cost and simplify processing of electronic circuits with a current measurement capability.

SUMMARY OF THE INVENTION

There may be a need to provide a possibility to manufacture electronic circuits with current measurement capability in a compact and efficient way.

According to an exemplary embodiment, a method of manufacturing an electronic circuit with an integrally formed capability of providing information indicative of a value of a current flowing in the electronic circuit is provided, wherein the method comprises forming an electrically conductive wiring structure on a substrate, configuring a first section of the wiring structure for contributing to a predefined use function of the electronic circuit, and configuring a second section of the wiring structure for providing information indicative of the value of the current flowing in the electronic circuit upon applying a stimulus signal to the second section, wherein at least a part of the configuring of the first section and the configuring of the second section is performed simultaneously.

According to another exemplary embodiment, a method of manufacturing an electronic circuit with an integrally formed capability of providing information indicative of a value of a current flowing in the electronic circuit is provided, wherein the method comprises forming an electrically conductive wiring structure on a substrate, the wiring structure comprising a first section for contributing to a predefined use function of the electronic circuit and an at least partially simultaneously formed second section for providing information indicative of the value of the current flowing in the electronic circuit upon applying a stimulus signal to the second section, modifying the second section so as to adjust its ohmic resistance, and mounting a functional component providing the use function on the first section.

According to yet another exemplary embodiment, an electronic circuit is provided which comprises an electrically insulating substrate, and an electrically conductive wiring pattern on the electrically insulating substrate, wherein a first section of the wiring pattern is configured for contributing to a predefined use function of the electronic circuit, and a second section of the wiring pattern comprises a shunt resistance trace, wherein two stimulus application pads for applying a stimulus signal and two stimulus response measurement pads for measuring a response of the shunt resistance trace to the stimulus signal are connected to the shunt resistance trace which is configured as a resistive measurement path for a shunt resistance measurement to determine information indicative of a value of an electric current flowing in the electronic circuit based on the response signal measured upon applying the stimulus signal.

According to yet another exemplary embodiment, an electronic circuit is provided which comprises a substrate, and an electrically conductive wiring pattern on the substrate, wherein a first section of the wiring pattern is configured for contributing to a predefined use function of the electronic circuit, and a second section of the wiring pattern comprises a shunt resistance trace as a resistive measurement path for a shunt resistance measurement to determine information indicative of a value of current flowing in the electronic circuit based on a response signal measured at the shunt resistance trace in response to applying a stimulus signal to the shunt resistance trace, and wherein the first section and the second section are made of the same material.

According to yet another exemplary embodiment, a section of an existing wiring structure on a substrate of an electronic circuit is used for measuring, by a shunt resistance measurement, information indicative of a value of a current flowing in the electronic circuit upon applying a stimulus signal to the section.

An exemplary embodiment has the advantage that electronics for a current measurement in an electronic circuit can be integrated in a wiring structure of the electronic circuit which needs anyhow be present for providing a wiring for a use function of the electronic circuit. This makes it possible to use an existing wiring concept in a synergetic way also for current measurement so that a separate surface mounted shunt device becomes dispensable. Thus, the electronic circuit can be manufactured in a simple way, in a compact manner and with a rapid processing.

DESCRIPTION OF FURTHER EXEMPLARY EMBODIMENTS

In the context of the present application, the term "wiring" may particularly denote a system or network of electric wires for electrically contacting an electronic circuit with regard to an environment and for electrically contacting internal components of the electronic circuit to one another.

In the context of the present application, the term "wiring pattern" may particularly denote a pattern of one or more particularly planar electrically conductive layers forming a wiring structure of the electronic circuit.

In the context of the present application, the term "use function" may particularly denote a functional task which the electronic circuit actually fulfils. Such a functional task or use function may be a switching function, an electric inverter function, a rectifying function, and electric energy charging function, a control function, etc.

In the context of the present application, the term "contributing to a use function" may particularly denote that either the wiring alone provides the use function, or the use function is provided by a combination between the wiring and a functional component mounted on the wiring or being partially or completely integrally formed with the wiring.

In the context of the present application, the term "functional component" may particularly denote a circuit component such as an integrated circuit component, a surface mounted device, and electronic chip (for example a semiconductor chip), etc., which is configured to fulfil the use function assigned to the functional component.

In the context of the present application, the term "stimulus signal" may particularly denote an electric signal to be applied to the second section of the wiring as a basis for the current measurement. Such a stimulus signal may be an electric current to be measured or being a fingerprint of an electric current to be measured. The stimulus signal is the signal which is supplied to the shunt resistance as a basis for the measurement. In response to the application of the stimulus signal, the second section of the wiring/the shunt resistance generates a response signal such as a voltage drop. Detection of the voltage drop and knowledge of the ohmic resistance value of the shunt resistance allow to derive the electric current value, for instance by applying Ohm's law. Hence, the stimulus signal may be the electric current signal to be measured. The response signal may be the voltage drop resulting from the application of the stimulus signal to the shunt resistance.

In the context of the present application, the term "shunt resistance trace" may particularly denote a flat strip of an electrically conductive material run in physical contact along the substrate. Thus, the shunt resistance trace may be configured as an electrically conductive trace such as a conductive track, a conductive path or a strip conductor. Such a conductive trace may be an electrically conductive structure of a strip-shaped geometry which, for instance, can be directly applied on a substrate.

In the context of the present application, the term "simultaneously" may particularly denote "at the same time" or "in the same time interval". However, "simultaneously" my also denote that one and the same configuring procedure configures both the first section and the second section.

In the following, further exemplary embodiments of the methods and the electronic circuits will be explained.

A gist of an exemplary embodiment can be seen in that a measurement architecture for determining electric current amounts can be realised by the use of an existing wiring concept and therefore without the need of separate electronic components or separate wiring layers. By simply patterning one or more existent wiring layers, a portion of the latter can be used as a reference ohmic resistance probe for current measurement. For further improving the accuracy of the current measurement, the ohmic resistance which may be exclusively embodied as a part of the wiring structure can be optionally adjusted to modify its resistance value for example by doping or trimming, until a desired target value of the ohmic resistance is obtained. When the electrically conductive wiring structure is designed in such a manner that it can also be used as a current sensor, no separate procedure is necessary in order to form a shunt resistance.

In an embodiment, the method comprises selectively modifying at least a part of the second section (particularly after having formed the wiring structure) so as to adjust a value of the ohmic resistance of the second section. Thus, a fine tuning of the physical and/or chemical properties of the second section of the wiring structure or of a part thereof allows also to fine tune its electric properties, particularly the value of the ohmic resistance. Advantageously, the second section may be modified so that the ohmic resistance of a reference resistive path/shunt resistance trace of the second section is significantly larger than the ohmic resistance of connected supply lines of the second section. At the same time, the value of the ohmic resistance of the reference resistive path/shunt resistance trace shall not become too large to avoid excessive generation of heat. Hence, a proper trade-off between these two boundary conditions can be made when adjusting the resistance value of the reference resistive path/shunt resistance trace.

In an embodiment, the method comprises adjusting the resistance of the second section to a predefined target resistance value. For example when manufacturing a batch of electronic circuits, their current measurement performance should be predictable or reproducible. In order to balance out individual differences between different electronic circuits manufactured in a batch, the material properties of the second section may be adjusted so as to obtain a desired value of the ohmic resistance in each electronic circuit.

In an embodiment, the method comprises modifying a material or chemical composition of the second section. Particularly, the material of the first section and the material of the shunt resistance trace may differ only concerning a dopant concentration. Implanting electrically conductive particles such as metal atoms or ions may allow to reduce the ohmic resistance, whereas implanting semiconductive or electrically insulating particles may allow to increase the ohmic resistance.

Particularly, modifying the material composition may be accomplished by doping selectively the second section, and/or by implanting or diffusing particles selectively into the second section. The selective injection of the particles only into the second section or part thereof can be ensured by using an appropriate mask uncovering only a portion of the surface of the electronic circuit into which the particles are to be injected.

In an embodiment, the method may additionally or alternatively comprise structurally trimming selectively the second section. In this context, the term "trimming" may particularly denote changing the physical dimensions of the second section or part thereof, particularly by removing part of its material or by adding (particularly electrically conductive) material thereto. Particularly, the material of the first section and the material of the shunt resistance trace of the second section may be the same, and the first section and the shunt resistance trace/the second section may differ only concerning their physical dimensions. Since the value of the ohmic resistance of a wiring structure also depends on its structural properties such as length and cross section of a conductive path, adding (for instance by deposition) or removing (for instance by etching) material allows to selectively increase or decrease the value of the resistance.

In an embodiment, configuring the second section comprises integrally forming a shunt resistance as part of the second section of the wiring structure. Particularly, the shunt resistance for current measurement may form an integral part of the wiring structure. More particularly, the method may comprise configuring a part of a patterned planar layer of electrically conductive material forming the second section as a resistive measurement path for a shunt resistance measurement to determine the information indicative of the value of the current flowing in the electronic circuit upon applying the stimulus signal. Hence, in contrast to conventional approaches, an exemplary embodiment forms a shunt resistance as a part of the wiring of an electronic circuit and hence without the necessity of mounting a separate functional component such as a surface mounted device on the substrate or the wiring. In contrast of this, the shunt resistance may be formed as a monolithically integrated wiring portion according to an exemplary embodiment.

In an embodiment, at least a part of the configuring of the first section and the forming of the shunt resistance is performed simultaneously. Thus, the shunt resistance trace may be formed by the patterning process of a continuous electrically conductive layer, and hence without a separate procedure.

In an embodiment, configuring the first section and the second section of the wiring structure comprises patterning a single planar layer of electrically conductive material into the first section and the second section simultaneously. For instance, an electrically conductive layer such as a metal layer (for example made of copper or aluminium) may be deposited as a planar layer on a planar substrate and may thereafter be patterned by performing an etching and lithography process. In such an embodiment, the entire shunt resistance including connection pads for applying a stimulus signal and for detecting a measurement signal may be formed as part of a single planar metallisation layer.

In an alternative embodiment, forming and configuring the first section and the second section of the wiring structure comprises depositing a plurality of electrically conductive structures (which may be embedded in an electrically insulating or semiconductive matrix) and patterning them into the first section and the second section. Thus, a plurality of metallisation layers deposited and patterned for realising at least part of the use function may be synergetically used for forming the shunt resistance. This may involve formation of horizontal electrically conductive structures (such as layers) as well as vertical electrically conductive structures (such as vias).

In an embodiment, the method further comprises encapsulating at least a part of the deposited and patterned electrically conductive structures by a mould structure. Thus, the electronic circuit may comprise a mould structure encapsulating at least part of the first section and at least part of the second section. A mould structure (which may also be denoted as an encapsulation structure) may serve for packaging components of the electronic circuit. In the context of the present application, the term "packaging" may particularly denote that electronic circuit components are housed or accommodated in a package. A package, in turn, can be denoted as a casing (for instance of a plastic, a glass or a ceramic material) which contains the electronic circuit components. Such a package may provide protection against impact and corrosion, may hold contact pins or leads of an electronic chip and/or may dissipate heat produced by the electronic circuit components in normal operation.

In an embodiment, the first section is configured for providing the predefined use function itself/alone, or serving as an electric coupling structure for electrically contacting an electronic functional component actually providing the use function when be mounted on the first section. Such a functional component may for instance be an electronic chip or any other electronic surface mounted device. When such a functional component is electrically connected to the first section, the interaction between first section and functional component provides the use function. Alternatively, the first section may provide the use function alone. In this case, the electronic circuitry required for providing the use function is part of the first section itself.

In an embodiment, the electronic circuit is configured for using an electric supply signal, for instance a supply voltage (which may also be denoted as the operating voltage, $V_{dd}$), for powering the first section also as stimulus signal to be applied to the second section. In other words, the current measured by the shunt resistance can be the supply current of one or more electronic chips mounted directly or indirectly on the wiring structure as well. When the electric supply voltage is applied to the shunt resistance, an overcurrent can be immediately detected by the second section. Upon detecting an overcurrent, a predefined consequence can be triggered. For instance, a corresponding control unit may then regulate the electric current so that that the current flow is reduced, or the electronic circuit can be switched off.

In an embodiment, the second section providing the current measurement capability is free of a surface-mounted device. By integrating a shunt resistance in a wiring, weight, costs and dimensions of the electronic circuit may be reduced and quality issues arising from attaching an external surface mounted device on the substrate may be avoided.

In an embodiment, the entire wiring pattern is formed as a single planar patterned layer on the substrate. A corresponding embodiment is shown in FIG. 7 to FIG. 9 and is very compact and very simple in construction.

In an alternative embodiment, the wiring pattern is formed as a plurality of planar patterned layers comprising as at least one via extending perpendicularly to the layers for connecting them. Corresponding embodiments are shown in FIG. 2 to FIG. 6 and allow for a three-dimensional integration even of sophisticated electronic components.

In an embodiment, the substrate and the wiring structure form part of a Direct Copper Bonding (DCB) device and a Direct Aluminium Bonding (DAB) device. Particularly, a DCB substrate may be used which comprises a ceramic (or other material being electrically insulating) sheet directly between a copper layer and another copper layer. A DCB substrate provides a proper basis for mounting one or more electronic chips on one copper side and for patterning the corresponding copper layer for forming the wiring structure. Also by the use of a DAB substrate this goal may be achieved. DCB and DAB devices or substrates are commercially available and therefore allow for a cost efficient solution of the mounting and patterning issues.

In an embodiment, the shunt resistance trace or wiring trace forms a first portion of a wiring level which also comprises a second portion forming part of the second section. In such an embodiment, both the first portion and a second portion may be formed in the same plane. Hence, the electronic circuit may be manufactured compact in vertical direction.

In an embodiment, the electronic circuit comprises one or more electronic chips (such as a semiconductor chip) mounted on the first section for providing the use function. In an embodiment, the electronic chip comprises at least one integrated circuit component of a group consisting of a switch, a diode, a half bridge, and an inverter. Integrated circuit components of the electronic chips may hence be switches (such as a metal-oxide-semiconductor field effect transistor (MOSFET), an IGBT, etc.), half bridges (i.e. an inverter leg, with two switches and corresponding diodes), full bridges, and three-phase inverters (i.e. six switches and corresponding diodes).

In an embodiment, the electronic circuit is configured as one of the group consisting of a power module for an automotive application, and a microelectromechanical system. In one embodiment, one or more electronic chips may be used as sensors or actuators in microelectromechanical systems (MEMS), for example as pressure sensors or acceleration sensors. In another embodiment, one or more electronic chips may be used as semiconductor chips for power applications for instance in the automotive field and may for instance have at least one integrated insulated-gate bipolar transistor (IGBT) and/or at least one integrated diode. The electronic circuit may particularly be configured as a control module for a vehicle engine (such as a hybrid engine).

As semiconductor substrate of electronic chips of the electronic circuit, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology. For packaging, moulding or encapsulation, a plastic material or a ceramic material may be used. Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

In an embodiment, a method of operating an electronic circuit comprising an electrically conductive wiring structure on a substrate, wherein a portion of the electrically conductive wiring structure of the electronic circuit is adapted to contribute to a predefined use function of the electronic circuit, is provided, wherein the method comprises determining information indicative of the value of a current flowing in the electronic circuit by using said portion of the electrically conductive wiring structure. Such an operating method may be combined with any of the other embodiments described herein.

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 3 shows a cross sectional view of an electronic circuit according to an exemplary embodiment.

FIG. 4 shows a plan view of the electronic circuit of FIG. 3.

FIG. 5 and FIG. 6 show cross sectional views of electronic circuits according to exemplary embodiments being similar to FIG. 3 but showing the electronic circuit after modifying properties of portion of its wiring for resistance adjustment purpose.

FIG. 10 shows a block diagram of a method of manufacturing an electronic circuit with an integrally formed capability of providing information indicative of a value of a current flowing in the electronic circuit according to an exemplary embodiment.

FIG. 11 is a three-dimensional view of a conventional electronic circuit in which a shunt resistance is provided as a surface mounted device.

DETAILED DESCRIPTION OF EXEMPLARY EMBODIMENTS

Figure 1:
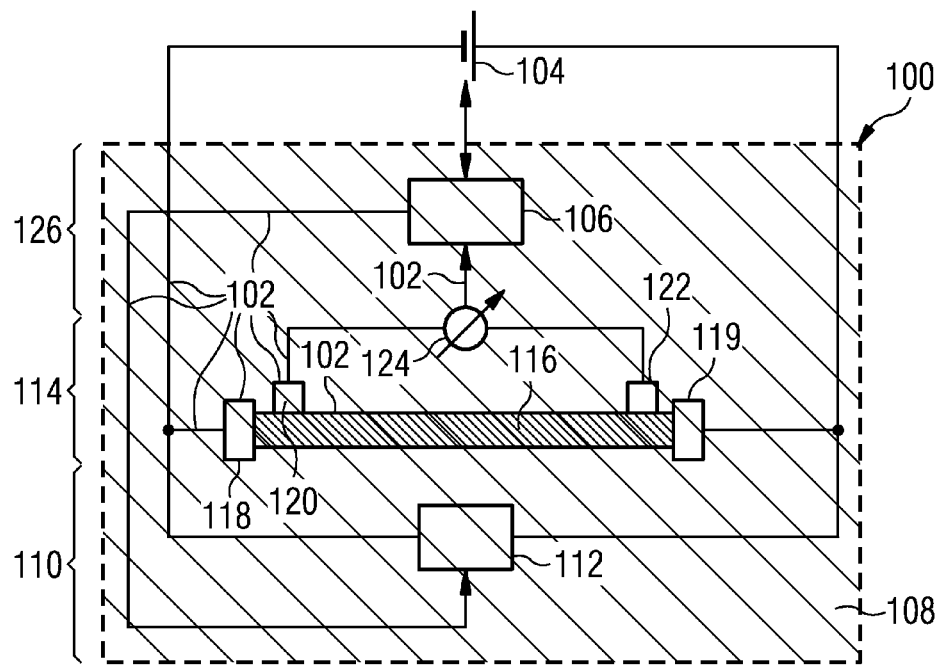
FIG. 1 is a schematic view of an electronic circuit according to an exemplary embodiment having a current measurement capability integrated into a wiring structure.

The illustration in the drawing is schematically.

Before describing further exemplary embodiments in further detail, some basic considerations of the present inventors will be summarized based on which exemplary embodiments have been developed which provide for a cost-efficient and compact manufacture of an electronic device with current measurement capability.

As an overload protection and/for regulating electronic circuits, it is advantageous to measure the electric current amount flowing through the electronic circuit.

Conventionally, as illustrated in FIG. 11, a separate shunt resistance member 1100 is mounted on electrically conductive contacts 1102 of an electronic circuit 1150 to be protected or regulated after the manufacture of the electronic circuit 1150. The electrically conductive contacts 1102 are, in turn, connected to conducting structures 1104.

However, this conventional concept is cumbersome, since it requires a separate surface mounted device in form of the shunt resistance member 1100 and also requires a separate mounting procedure with corresponding time and resource expenses as well as additional quality risks.

According to an exemplary embodiment, an electrically conductive measurement path in the electronic circuit is realised by adapting or synergetically using a wiring/layout which is present for realising the electronic circuit anyway. By this architecture, it becomes possible to measure an electric current flowing in the electronic circuit during normal operation of the electronic circuit by a shunt resistance measurement method.

In order to further increase the measurement accuracy, it is possible for selectively modifying the conductive measurement path after the formation of the circuit design by a specific implantation or diffusion of particles of a chemical composition differing from the material of the wiring. By taking this measure, the electric behaviour of the conductive measurement path may be precisely altered in order to adapt it, if necessary or desired, for using it for the shunt resistance measurement method.

It is also possible to increase the measurement accuracy by an additional adjustment of dimensions (for instance mechanical methods, laser trimming, etc.) of the conductive measurement path.

FIG. 1 is a schematic illustration of an electronic circuit 100 according to an exemplary embodiment having a current measurement capability integrated into a wiring structure 102. Limits of the electronic circuit 100 are shown as dotted lines in FIG. 1. Alternatively to the shown architecture, an electronic circuit 100 according to an exemplary embodiment may comprise further elements (such as additional electronic chips or other surface mounted devices, a current source 104, etc.), or some of the shown elements of the electronic circuit 100 may be arranged apart from the electronic circuit 100 (such as a controller 106).

The electronic circuit 100 may comprise an electrically insulating substrate 108 which may for instance be a glass-reinforced epoxy laminate sheet (such as a composition which is known by a skilled person as FR4) of a printed circuit. board (PCB) or which may alternatively be a ceramic sheet of a Direct Copper Bonding (DCB) substrate (in which both opposing main surface is of a ceramic sheet may be covered by a copper sheet). All components which are mentioned in the following are mounted on the electrically insulating substrate 108.

On the electrically insulating substrate 108, the wiring pattern 102 is formed. It may be manufactured by (optionally depositing and) patterning one or more metallic layers on the electrically insulating substrate 108.

In the shown embodiment, the wiring pattern 102 is divided into three sections.

A first section 110 of the wiring pattern 102 is configured for providing, in corporation with an electronic chip 112 mounted on and being electrically connected to the first section 110 of the wiring pattern 102, a switching function in terms of an automotive application such as the control of a hybrid engine. For this purpose, the electronic chip 112 may comprise an insulated gate bipolar transistor (IGBT) as an integrated circuit component.

A second section 114 of the wiring pattern 102 comprises a shunt resistance trace 116 being a strip-shaped trace of electrically conductive material and having a precisely defined value of the ohmic resistance to serve as a shunt resistance for a current measurement task. The second section 114 furthermore comprises two stimulus application pads 118, 119 for applying an operating current, as a stimulus signal, provided by external current source 104 for supplying all components of the electronic circuit 100 with electric energy to the shunt resistance trace 116. Moreover, the second section 114 comprises two stimulus response measurement pads 120, 122 for measuring a response signal of the shunt resistance trace 116 when the stimulus signal is applied. This response signal may be a voltage drop which results from the electric current flowing along the resistive shunt resistance trace 116. This voltage drop may be measured by a Voltmeter 124.

A third section 126 of the wiring structure 102 serves as a basis for mounting and electrically coupling controller 106 to the electronic circuit 100. The measured voltage drop can be supplied to the controller 106. The controller 106 may calculate the value of the electric current flowing through the electronic circuit 100 based on the detected voltage drop and the knowledge of the ohmic resistance of the shunt resistance trace 116. The controller 106 may control the arrangement of FIG. 1 in accordance with the result of the determination of the value of the electric current. For instance, controller 106 may compare the measured electric current value with a predefined threshold value. If the threshold value is exceeded by the measured electric current, this may be interpreted by the controller 106 as an overcurrent so that the controller 106 may control the current source 104 to reduce the amount of current supplied to the electronic circuit 100.

Figure 2:
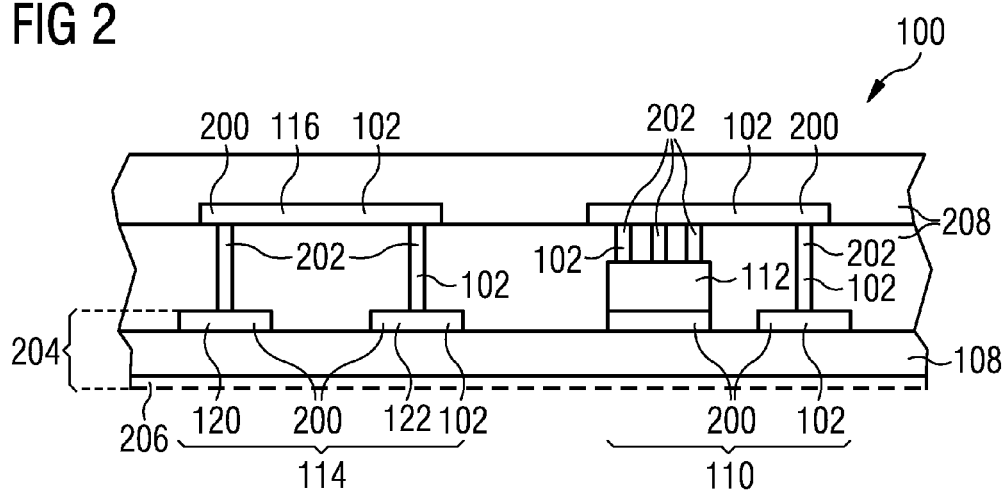
FIG. 2 shows a cross sectional view of a layout of the electronic circuit of FIG. 1.

FIG. 2 shows a cross sectional view of a layout according to which the electronic circuit 100 of FIG. 1 may be embodied.

FIG. 2 particularly illustrates that the wiring structure 102 comprises planar sections 200 formed by patterning deposited or already existing continuous metal layers. Additionally, the wiring structure 102 comprises vertical sections in the form of vias 202 connecting planar sections 200 of different height levels to one another. Both the planar sections 200 as well as the vias 202 are used for providing wiring connections for the electronic chip 112 and are and they are for present anyhow. According to an exemplary embodiment, these wiring connections are synergetically used also for forming the current measurement part of the electronic circuit 100, inter alia the shunt resistance trace 116.

FIG. 2 also illustrates that the lower layers of the electronic circuit 100 can be formed based on a Direct Copper Bonding (DCB) substrate 204. DCB substrate 204 is constituted by the electrically insulating substrate 108 having two opposing main surfaces which are both covered with a respective copper layer. The lower copper layer is denoted with reference numeral 206, whereas the upper copper layer has been patterned to form wiring components denoted with reference numerals 120, 122, 200. As can furthermore be taken from FIG. 2, all circuit components formed on the electrically insulating substrate 108 have been encapsulated by for instance two subsections of an appropriate plastic or ceramic material, thereby forming mould structure 208 packaging the individual components of the electronic circuit 100.

In the following, referring to FIG. 3 to FIG. 6, it will be described as to how the electric properties of the shunt resistance trace 116 can be adjusted to meet a predefined criterion concerning the value of its ohmic resistance. FIG. 3 shows a cross sectional view of a part of electronic circuit 100 being very similar to the one shown in FIG. 2. FIG. 4 shows a plan view of the electronic circuit 100 of FIG. 3. FIG. 5 and FIG. 6 show cross sectional views of electronic circuits 100 according to exemplary embodiments being similar to FIG. 3 but showing the respective electronic circuit 100 after modifying its shunt resistance trace 116 for adjusting its ohmic resistance value.

FIG. 5 shows that an upper portion of the mould structure 208 has been removed, for instance by etching. A mask 500 has been applied to the resulting surface, however exposing a central portion of the shunt resistance trace 116. Subsequently, particles such as atoms may be implanted in the exposed surface of the shunt resistance trace 116, see reference numeral 502. The implanted material may selectively improve or deteriorate the electrically conductive properties of the shunt resistance trace 116, thereby allowing to decrease or increase its ohmic resistance value.

Additionally or alternatively, a mechanical trimming of the shunt resistance trace 116 is possible to adjust its ohmic resistance value, as can be taken from FIG. 6. For this purpose, it is again possible to cover part of the surface of the electronic circuit 100 with a mask 500. Then, the exposed central portion of the shunt resistance trace 116 may be removed by etching. This will locally thin the shunt resistance trace 116, thereby increasing its ohmic resistance value. Alternatively, as indicated with a dotted line in FIG. 6, it is possible to add electrically conductive material (for instance by an appropriate deposition procedure) to the shunt resistance trace 116, thereby decreasing its ohmic resistance value.

Figure 7:
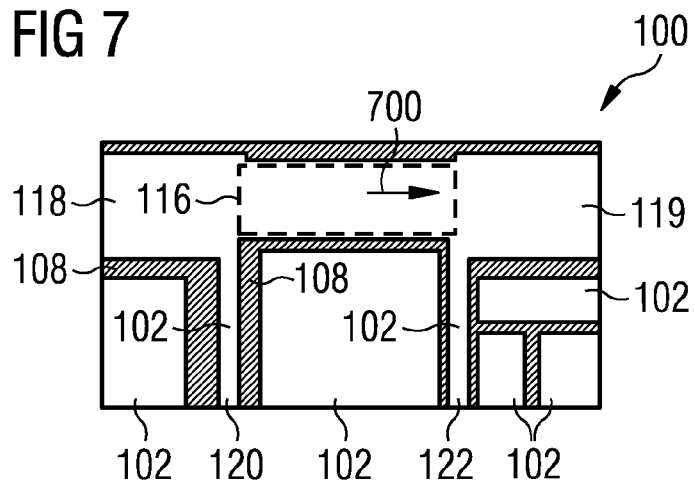
FIG. 7 is a plan view of a part of an electronic circuit according to another exemplary embodiment having a current measurement capability integrated into a single patterned layer as wiring structure.

FIG. 7 is a plan view of a part of an electronic circuit 100 according to another exemplary embodiment having a current measurement capability integrated into a wiring structure 102 formed by a single patterned continuous layer of electrically conductive material and also providing a use function such as a hybrid engine control (the corresponding part of the electronic circuit 100 is not shown).

FIG. 7 shows that a single continuous electrically conductive layer has been patterned on an electrically insulating substrate 108 which is in this case a substrate of a printed circuit board. A part of this wiring is configured as a shunt resistance trace 116. The direction of the current flow in operation is denoted with reference numeral 700. The shunt resistance trace 116 serves as a measurement path and can be formed with a defined length and width. It is connected to stimulus application pads 118, 119 and stimulus response measurement pads 120, 122 at the beginning and the end. The shunt resistance trace 116 including its pads 118, 119, 120, 122 are all formed within one and the same metallization layer.

Figure 8:
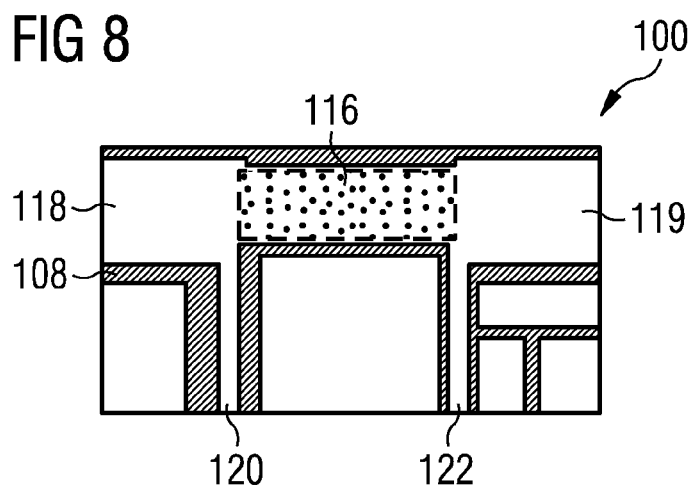
FIG. 8 and FIG. 9 show cross sectional views of electronic circuits according to exemplary embodiments being similar to FIG. 7 but showing the electronic circuit after modifying properties of portion of its wiring for resistance adjustment purpose.
Figure 9:
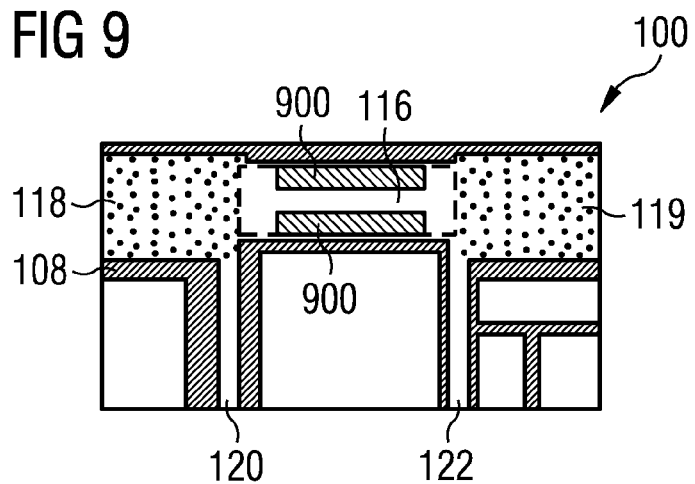

FIG. 8 and FIG. 9 show cross sectional views of electronic circuits 100 according to exemplary embodiments being similar to FIG. 7 but showing the respective electronic circuit 100 after modifying properties of part of its wiring structure 102 for resistance adjustment purpose.

According to FIG. 8, the shunt resistance trace 116 has been made subject to an implantation procedure, similar as in FIG. 5, to locally decrease the electric resistance by the introduction of electrically conductive particles such as metal atoms in the shunt resistance trace 116.

According to FIG. 9, the shunt resistance trace 116 has been made subject to a lateral thinning procedure, similar as in FIG. 6, to locally increase the electric resistance of the shunt resistance trace 116. Void spaces form which material of the shunt resistance trace 116 has been removed, have been filled with electrically insulating material 900. Additionally, electrically conductive particles have been selectively introduced into the stimulus application pads 118, 119 so as to locally decrease the electric resistance there.

FIG. 10 shows a block diagram 1000 of a method of manufacturing an electronic circuit 100 with an integrally formed capability of providing information indicative of a value of an electric current flowing in the electronic circuit 100 according to an exemplary embodiment.

In a block 1010, an electrically conductive layer is deposited on an insulator substrate. In a subsequent block 1020, the deposited electrically conductive layer is patterned to form a first section configured for mounting an insulated gate bipolar transistor (IGBT) chip, and to simultaneously form a second section configured as shunt resistance. In other words, a single common patterning procedure is carried out for forming both the first section and the section at the same time based on the same electrically conductive layer. In a block 1030, the IGBT chip is mounted on the first section and is connected to a supply voltage source. In a subsequent block 1040, selectively the second section is mechanically trimmed to adjust the shunt resistance value. The second section may be connected to the supply voltage source in a block 1050. In a block 1060, the second section is connected to an electric current detector for measuring the current value when the supply voltage is applied to both the IGBT chip and the shunt resistance.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of manufacturing an electronic circuit with an integrally formed capability of providing information indicative of a value of a current flowing in the electronic circuit, the method comprising:
    forming an electrically conductive wiring structure on a substrate;
    configuring a first section of the wiring structure for contributing to a predefined use function of the electronic circuit; and
    configuring a second section of the wiring structure for providing information indicative of the value of the current flowing in the electronic circuit upon applying a stimulus signal to the second section;
    wherein at least a part of the configuring of the first section and the configuring of the second section is performed simultaneously.

2. The method according to claim 1, wherein the method comprises selectively modifying at least a part of the formed second section so as to adjust a value of the ohmic resistance of the second section.

3. The method according to claim 2, wherein the method comprises modifying a material composition of at least a part of the second section.

4. The method according to claim 3, wherein the method comprises modifying the material composition by at least one of doping selectively at least a part of the second section, and diffusing particles selectively into at least a part of the second section.

5. The method according to claim 2, wherein the method comprises structurally trimming selectively at least a part of the second section.

6. The method according to claim 1, wherein configuring the second section comprises forming a shunt resistance as part of the second section of the wiring structure.

7. The method according to claim 6, wherein at least a part of the configuring of the first section and the forming of the shunt resistance is performed simultaneously.

8. The method according to claim 1, wherein configuring the first section and the second section of the wiring structure comprises patterning a single planar layer of electrically conductive material into the first section and the second section simultaneously.

9. The method according to claim 1, wherein configuring the first section and the second section of the wiring structure comprises depositing and patterning a plurality of electrically conductive structures into the first section and the second section simultaneously.

10. The method according to claim 9, wherein the method further comprises encapsulating at least a part of the deposited and patterned electrically conductive structures by a mould structure.

11. A method of manufacturing an electronic circuit with an integrally formed capability of providing information indicative of a value of a current flowing in the electronic circuit, the method comprising:
    forming an electrically conductive wiring structure on a substrate, the wiring structure comprising a first section for contributing to a predefined use function of the electronic circuit and an at least partially simultaneously formed second section for providing information indicative of the value of the current flowing in the electronic circuit upon applying a stimulus signal to the second section;
    modifying the second section so as to adjust its ohmic resistance; and
    mounting a functional component providing the use function on the first section.

12. An electronic circuit, comprising:
    an electrically insulating substrate;
    an electrically conductive wiring pattern on the electrically insulating substrate;
    wherein a first section of the wiring pattern is configured for contributing to a predefined use function of the electronic circuit, and a second section of the wiring pattern comprises a shunt resistance trace, wherein two stimulus application pads for applying a stimulus signal and two stimulus response measurement pads for measuring a response of the shunt resistance trace to the stimulus signal are connected to the shunt resistance trace which is configured as a resistive measurement path for a shunt resistance measurement to determine information indicative of a value of an electric current flowing in the electronic circuit based on the response signal measured upon applying the stimulus signal.

13. The electronic circuit according to claim 12, wherein the electronic circuit is configured for using an electric supply signal for powering the first section also as the stimulus signal to be applied to the second section.

14. The electronic circuit according to claim 12, wherein the material of the first section and the material of the shunt resistance trace differ only concerning a dopant concentration.

15. The electronic circuit according to claim 12, wherein the entire wiring pattern is formed as a single planar patterned electrically conductive layer on the substrate.

16. The electronic circuit according to claim 12, wherein the wiring pattern is formed as a plurality of planar patterned layers comprising at least one via extending perpendicularly to the layers.

17. The electronic circuit according to claim 12, comprising a mould structure encapsulating at least part of the first section and at least part of the second section of the wiring pattern.

18. The electronic circuit according to claim 12, wherein the shunt resistance trace forms a first portion of a wiring level which also comprises a second portion forming part of the second section.

19. An electronic circuit, comprising:
a substrate;
an electrically conductive wiring pattern on the substrate;
wherein a first section of the wiring pattern is configured for contributing to a predefined use function of the electronic circuit, and a second section of the wiring pattern comprises a shunt resistance trace as a resistive measurement path for a shunt resistance measurement to determine information indicative of a value of current flowing in the electronic circuit based on a response signal measured at the shunt resistance trace in response to applying a stimulus signal to the shunt resistance trace;
wherein the first section and the second section are made of the same material.

20. A method of using a section of an existing wiring structure on a substrate of an electronic circuit for measuring, by a shunt resistance measurement, information indicative of a value of a current flowing in the electronic circuit upon applying a stimulus signal to the section.

* * * * *